United States Patent [19]

Passmore et al.

[11] Patent Number: 4,856,862

[45] Date of Patent: Aug. 15, 1989

[54] OPTICAL STORAGE METHOD AND APPARATUS

[75] Inventors: Charles G. Passmore, Palos Verdes Estates; Robert D. Mowry, Huntington Beach; Alan G. Brown, Manhattan Beach, all of Calif.

[73] Assignee: Photonics Laboratories, Inc., Los Angeles, Calif.

[21] Appl. No.: 185,103

[22] Filed: Apr. 22, 1988

[51] Int. Cl.$^4$ ................................................ G02B 6/26
[52] U.S. Cl. .................................... 350/96.15; 369/50
[58] Field of Search ............... 350/96.15, 96.16, 96.18; 455/610, 611, 612; 370/3; 369/50

[56] References Cited

U.S. PATENT DOCUMENTS 4,473,270 9/1984 Shaw .................................. 350/96.15
4,653,042 3/1987 d'Auria et al. ........................... 370/3

OTHER PUBLICATIONS

"Materials for Optical Information Processing", Science, vol. 226, Nov. 9, 1984, pp. 657–662, by A. M. Glass.
"Single Mode Fiber Recirculating Delay Line", SPIE, vol. 326, Fiber Optics-Technology '82, 1982, pp. 108–115, by Newton et al.
"Rayleigh Backscattering in Optical Fiber Recirculating Delay Lines", Applied Optics, vol. 25, No. 7, Apr. 1, 86, pp. 1051–1055, by Nazarathy et al.
"A Planar Waveguide-Optical Fiber System for Holographic Memory Devices", Translated from Izvestiya Vysshikh Uchebnykh Zavedenii, vol. 24, No. 6, pp. 759–762, Jun. 1981, by Bykovskii.
"Dynamic Direct-Access Memory Utilizing Fiber Waveguides", Soviet Journal of Quantum Electronics 15(1) Jan. 1985, pp. 137–139, by Belvolov et al.
"Fiber-Optics Element for Information Storage", Soviet Tech. Phys. Letters 12(3), Mar. '86, pp. 143–145, by Gulyaev et al.
"Multiple Quantum Wells for Optical Logic", Science, vol. 225, Aug. 24, 1984, pp. 822–824.
"Optical Computing", Computers & Electronics, Jan. 85, pp. 64–67, cont. at p. 82, by Jeff Hecht.

Primary Examiner—William L. Sikes
Assistant Examiner—Akm E. Ullah
Attorney, Agent, or Firm—Blakely, Sokoloff, Taylor & Zafman

[57] ABSTRACT

A storage system based on the propagation delay of light is disclosed which utilizes an array of fiber optics to store the information. The storage device is configured as two loops. Data is injected from one loop and data is continuously recirculated for storage in the other loop. A pulsed laser provides the clocked energy source and is split for use, both, in recirculating the data, and for new data injection. Multiple channels of light are extracted by using a diffraction grating. The source may be interrupted to erase data in the recirculating memory. Recirculation takes place over a single strand fiber optics coil of any length. Multiple frequency encoded channels of data are multiplexed into the single strand of fiber optic with an integrating lens and the channels are decoupled on the other end with a diffraction grating. To prevent compounding signal degradation, optical switches are used to regenerate the signal at each pass through the loop. A beam splitter in the recirculating loop provides for data extraction through the use of a photosensor array. Data is injected into the recirculating loop by pulsing in light using electro-optical shutters. The device is useful for data storage in optical and digital computing. The device may also be used as a platform for recursive optical computing by the placement of optical computing components within the recirculating memory loop.

31 Claims, 2 Drawing Sheets

OPTICAL STORAGE METHOD AND APPARATUS

BACKGROUND OF THE INVENTION

1. Field of the Invention.

The present invention relates to the field of data storage devices.

2. Prior Art.

High speed data processing systems increasingly require associated storage devices capable of storing massive quantities of data. Historically, large quantities of data have been stored in magnetic media such as tapes, drums and disks. All such storage media require mechanical movement of a magnetically coated storage surface past one or more "read" heads. Memory access time is thus limited by the cycling time of the mechanical drive.

Semiconductor memories afford rapid data access, however, even the most efficient of such memories dissipate too much energy to make truly massive storage capacities practical.

It has long been theorized that vast quantities of data could be stored optically and that such data could be retrieved literally at the speed of light. Although optical devices for storing limited quantities of data pulses have been demonstrated, practical devices for dynamic optical storage of very large quantities of data have heretofore not been achieved.

Research in the field of optical data storage has been reported from the Soviet Union. For example, M. I. Belovolov et al have disclosed a recirculating memory in an article entitled "Dynamic Direct-Access Memory Utilizing Fiber Waveguides" appearing in Kvantovaya Elektron (Moscow) 2, 214–216 (Jan. 1985). An English translation of this article appeared in Sov. J. Quantum Electronics 15(1), Jan. 1985, pp. 137–139. Belovolov et al propose a dynamic direct access memory having a graded-index fiber waveguide 5 km in length. A laser diode emitter is encoded with digital data. The resulting sequence of light pulses is transmitted through the fiber waveguide and detected at the exit end by a photodiode. The detected signal is synchronized with the data clock and reapplied to the laser diode. Using TTL circuitry, Belovolov et al achieved a storage capacity of 103 bits at a clock frequency of approximately 10 MHZ. Channel multiplexing was suggested as one means of increasing memory capacity without increasing waveguide length. However, data rates for any one channel are inherently limited (2 GHZ is suggested as achievable) by the electrical regeneration techniques used.

Further work on the concepts of Belovolov et al is reported in an article by Yu. V. Gulyaev et al entitled "Fiber-Optics Element for Information Storage" appearing in Pis'ma Zh. Tekh. Fiz. 12, 350–354 (Mar. 26, 1986). An English translation of this article appeared in Sov. Tech. Phys. Lett. 12 (3), Mar. 1986, pp 143–145. Gulyaev et al describe a dynamic memory consisting of an optical fiber connected in a closed loop by an optical pulse regenerator. Digital information is encoded as bursts of emission of a semiconductor laser. The light pulses propogate through a single mode optical fiber and are reflected by a mirror coating at the exit end. Regeneration is achieved in the laser by generation of pump current pulses when the reflected optical pulses are injected back into the active region of the laser. The apparatus of Gulyaev et al thus reshapes the coded waveform on each circulation through the optical fiber storage medium without incurring the delay of electrically decoding the optical signal. However, since regeneration is accomplished within the laser itself, it is not possible to multiplex a plurality of storage channels within the bandwidth of the laser. Therefore, overall data density can be increased only by increasing the length of the fiber or by multiplexing storage channels having dedicated laster emitters.

A frequency multiplexed fiber optic data storage system is described by d'Auria et al in U.S. Pat. No. 4,653,042 issued Mar. 24, 1987 and entitled "Device for Storing Information in an Optical Fiber Transmission System." d'Auria et al disclose a method for using an existing fiber optic data transmission line as a storage medium. Data is transmitted from one station to another at a first wave length. Data to be stored is encoded on an emitter operating at a second wavelength and injected into the fiber optic line. A dichroic mirror at a remote station passes light at the data transmission wave length but reflects light at the data storage wavelength. Stored data is reflected back to the originating station where it is detected and converted to an electrical signal which is then reapplied to the data storage emitter to regenerate the stored data as an optical signal.

As in other systems employing opto-electronic signal regeneration, the storage capacity of d'Auria et al's apparatus is inherently limited by the operating frequency of the opto-electronic devices. 100 MHZ is suggested as a realistic operating frequency, thereby resulting in a storage capacity of approximately 103 bits per km per channel.

An optical storage device that does not depend on optoelectronic regeneration is described by Shaw in U.S. Pat. No. 4,473,270 issued Sept. 25, 1984 and entitled "Splice-Free Fiber Optic Recirculating Memory." Shaw discloses a fiber optic memory in which a single mode optical fiber is coupled to itself to form a closed-loop which acts as a delay line. Coupling is achieved by juxtaposition of polished tangential surfaces at each end of the fiber so that a portion of the light which is leaving the loop is coupled back into the loop. When data is injected into the loop, the output will be a serial repetition of the input signal with decreasing amplitude at intervals corresponding to the length of the loop. Because only a portion of the light signal is coupled back into the loop without amplification, the data signal quickly decays so that long term storage of data is impractical.

It is apparent that none of the prior art optical storage devices provide a practical means for storing massive quantities of data for extended periods of time. All such systems either require opto-electronic signal regeneration, thereby limiting the data rate; or employ optical regeneration techniques that limit the data bandwidth and/or the storage duration Furthermore, prior art systems that have employed frequency multiplexing to increase storage capacity have required a dedicated laser emitter for each storage channel, thereby imposing practical limits on the extent of parallelism that can be achieved.

With respect to the present invention the general construction, operation and technology of the various high speed optical devices used therein are described in various articles including the following; "Multiple Quantum Wells for Optical Logic", Arthur L. Robinson, Science Vol. 225, Aug. 1984 ; "Optical Computing", Jeff Hecht, Computer & Electronics Jan. 1985;

"Materials for Optical Information Processing", A. M. Glass, Science Vol. 226, Nov. 1984.

BRIEF SUMMARY OF THE INVENTION

A storage system based on the propagation delay of light is disclosed which utilizes an array of fiber optics to store the information. The storage device is configured as two loops. Data is injected from one loop and data is continuously recirculated for storage in the other loop. A pulsed laser provides the clocked energy source and is split for use, both, in recirculating the data, and for new data injection. Multiple channels of light are extracted by using a diffraction grating. The source may be interrupted to erase data in the recirculating memory. Recirculation takes place over a single strand fiber optics coil of any length. Multiple frequency encoded channels of data are multiplexed into the single strand of fiber optic with an integrating lens and the channels are decoupled on the other end with a diffraction grating. To prevent compounding signal degradation, optical switches are used to regenerate the signal a each pass through the loop. A beam splitter in the recirculating loop provides for data extraction through the use of a photosensor array. Data is injected into the recirculating loop by pulsing in light using electro-optical shutters. The device is useful for data storage in optical and digital computing. The device may also be used as a platform for recursive optical computing by the placement of optical computing components within the recirculating memory loop.

DETAILED DESCRIPTION OF THE INVENTION

The present invention comprises an optical storage method and apparatus for providing high speed and high capacity storage of digitally encoded data in a fiber optic element using the propagation of light as the storage medium. Under normal conditions, the speed of light is considered to be substantially infinitely fast so that the propagation time of light would be considered too short for use in information storage. In recent years however, major advances in optical shutter operating speeds and photon detector response has allowed the consideration of the short propagation delay of light through a long fiber optic as a method of retaining data. It is the basis of this propagation delay through encoding digital pulses and allowing them to move in a circular fashion over a fiber optic coil that makes the present invention possible. Further, through the use of parallelism and automatic optical data regeneration, extremely high storage capacities and data rates may be achieved.

Figure 1:
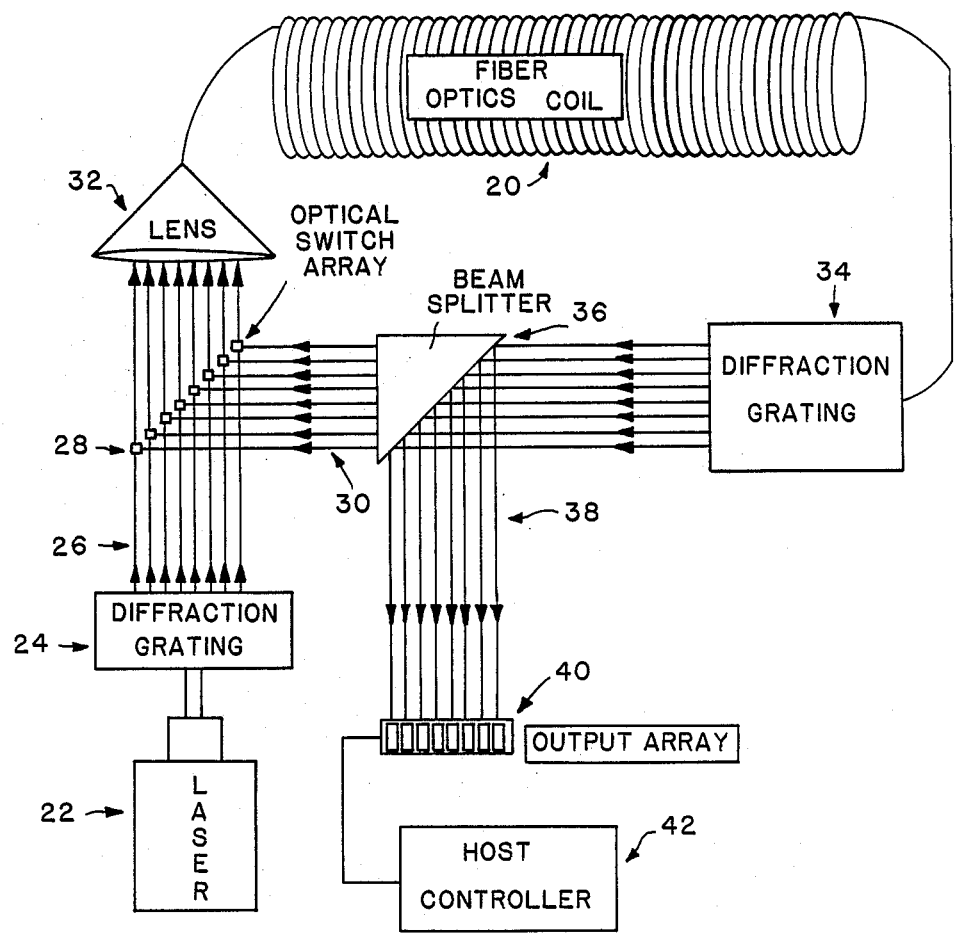
FIG. 1 is a schematic diagram of the data maintaining and reading method and apparatus of the optical storage system of the present invention.

To provide an explanation of the full operation of the invention, the method and apparatus for maintaining data in the fiber optic coil and reading the same will be first described. Then the method and apparatus will be expanded to include the write and erase functions of the system. Thus, first referring to FIG. 1, a schematic diagram illustrating the basic recirculating optical data path of the preferred embodiment of the present invention may be seen. The basic data path in the system of the present invention, of course, is a single fiber optic coil 20 which, by way of example, may have a length on the order of one kilometer or more. The optical energy source for the system is one or more pulsed lasers 22 which provide a pulsed light source or sources for the system. Since the light from the light source is split into a number of channels or bands, each of its own unique frequency range, it is preferred to use liquid lasers for tunability to provide the relatively wide frequency bandwidth desired.

The relatively wide bandwidth output of the laser system 22 is first split into a number of individual frequency bands, each of which will become an individual storage channel. Since it is desired to make the number of storage channels as high as reasonably possible, the spacing between channels should be maintained as small as reasonably possible, such as on the order of five Angstroms or less per channel. To achieve this separation of the light into the various channels, a diffraction grating 24 is used in the preferred embodiment. In general, diffraction gratings will allow the separation of the relatively broad band light into a large plurality of individual narrow bands within the broader total bandwidth, to provide a large plurality of frequency and spacially separated beams of pulsed light energy. In that regard, note that the frequency separation is separation based upon the light frequency, typically though not necessarily in the visible range, rather than the frequency of the pulsing, which should be simultaneous across all channels.

The pulse frequency used is limited at the upper end by the performance of various optical devices yet to be described, though preferably should be as high as possible, as the storage capacity for a given fiber optic length is directly proportional to that frequency. By way of specific example, the diffraction grating 24 in a fully configured system might provide a 512 by 512 array of channels, or approximately 256,000 spacially and frequency separated channels. If a pulse frequency on the order of 1,000 gigahertz could be used, a one kilometer fiber optic element could effectively store 760 gigapulses, each one as subsequently shall be seen, potentially carrying one bit of information.

While various types of devices could be used in place of or for the diffraction grating 24, holographic diffraction gratings are preferred, as such gratings may be created to further include a tailored transmission versus frequency characteristic so as to reshape the intensity versus frequency characteristic of the laser source by substantially flattening the same to make all channels of substantially equal light intensity. This is a highly desirable characteristic, as there is a minimum intensity below which the system will not properly respond to a given channel, whereas a higher than necessary intensity will only create unnecessary heating, noise and possible cross talk between channels, and may not allow certain devices of the system to operate at their maximum speed potential.

The light in the individual light channels 26 is directed to an optical switch array 28. The function of this switch array is to pass or block each of the individual channels as determined by the presence or absence of light 30 directed thereto for control purposes. In particular, each individual optical switch will pass or block a pulse of light in the respective channel of light 26 from the diffraction grating 24 dependent upon the presence or absence, respectively, of a corresponding pulse of light in the corresponding channel of light 30.

The light of the channels of light 26 which are passed by the optical switch array 28 is gathered by lens system 32 and fed to one end of the fiber optic coil 20. The transit time within the fiber optic coil, assuming a length of approximately one kilometer, will be on the order of 3 microseconds, after which the light will emerge from the other end of the fiber optic coil to be spread apart again into its component frequency channels by another diffraction grating 34. From there each individual channel is split into two components by a beam splitter 36, namely, the control light 30 and output light 38 directed to an output array 40. The control beams 30, each of which is directed to a respective optical switch of the optical switch array 28, control the same so that presence of a pulse of light in a channel of light 30 will enable the passage of a light pulse in the respective channel of light 26 through the optical switch array and through the lens 32 into the fiber optic coil 20. Similarly, the absence of a light pulse in a respective channel of light 30 will not enable the passage of the light pulse in the respective channel of light 26 through the respective switch of the optical switch array 28, and thus will not result in a light pulse in that channel being fed through the lens 32 and into the fiber optic coil 20.

Thus it may be seen that the light from the laser system 22 as separated into individual channels by the diffraction grating 24, and passed through the optical switch array as enabled by the pulse content of the various channels of light 30 is a replication of the various channels of the light 30, and thus for a one kilometer fiber optic coil, is a replication of that which was fed through lens 32 and into the fiber optic coil 20 approximately 3 microseconds earlier. Interpreting each light pulse as a one and the absence of a light pulse during a pulse period as a zero, it may be seen that whatever pattern of zeros and ones the pulses may take at any particular time in the 256,000 channels, that pattern will be recovered from the fiber optic line, replicated and reinserted in the fiber optic line every 3 microseconds. Since the pulse pattern in each successive pulse time will be so replicated, all data stored in the various channels of light in transit in the fiber-optic line is regenerated and recirculated on a continuous basis, all without requiring conversion to electrical or any other form and reconversion to light for reinsertion. This feature of the present invention is particularly important, as laser sources, laser pulsing and optical devices such as optical switches are many orders of magnitude faster (higher in frequency capabilities and faster in time response) than even typical high speed electronic devices. It is for this reason, as well as the high degree of parallelism achieved in the present invention, that allows the present invention optical storage device to store such large quantities of information.

One form of optical switch which is suitable for use with the present invention utilizes a plate-like structure which will only pass linearly polarized light of one orientation through one side thereof and will only pass linearly polarized light of an orthogonal polarization through the other side thereof. Thus without more, such an arrangement would block the light 26 received from the diffraction grating 24. Disposed between the two sides of the plate-like structure, however, is a layer of nitrobenzine (or other suitable material) which, if sufficiently illuminated with light from the side (referred to herein as the control light), will rotate the polarization of the polarized light passing therethrough, dependent upon the intensity of the control light, by approximately 90 degrees. Such devices, being entirely optical in character, provide very fast switches, and thus are suitable for use with the present invention.

Obviously, to accomplish the foregoing, the effective optical path lengths etc., must be closely controlled and the pulse frequency must be very accurate for the pulsing of the light 26 and the pulsing of the control light 30 to be in phase. In addition, there will be some scatter in the fiber optic coil 20 so that the shape of a pulse of light will deteriorate in transit in the fiber optic element. The main effect of this deterioration however, is to broaden the pulse, which to some extent is desirable, as a broader pulse in the control light 30, properly phased, will result in the passing of the entire narrower pulse in light 26. Thus the characteristics of the new pulses in the various channels being inserted into the fiber optic coil 20 are determined by the pulsed laser 22 and not by the deteriorated pulse shape of the light in the various channels of light 30, light 30 (or the absence thereof) in each channel only determining whether the light pulse in that channel from laser 22 will or will not be passed by the respective optical switch in optical switch array 28 to the lens 22 and the fiber optic coil 20.

As previously mentioned, the splitter 36 will split off a portion of the light from each of the recovered channels and direct the same to an output array 40. In general, the beam splitter 36 will be proportioned and the optical switch array 28 biased so that the switches may be tripped from one state to the other with a minimum of incremented light intensity, thereby maximizing the amount the intensity incident to the output array 40. However, because of the extremely high pulse rate, conventional sensors under computer control cannot be used. Also, at best the total light energy in each pulse will be relatively low, so that any substantial noise in an output sensor will mask the pulse being sensed. In general, noise in typical photon sensors is typically thermally generated, so that adequate noise immunity may be achieved by appropriate cooling thereof. Further, because of the time required to electrically sense a signal and to get ready to sense another pulse, current state of the art requires the optical isolation of individual light pulses and the reading not of each successive pulse, but rather of no more than each Nth pulse. For this purpose, by way of example, a shutter-like device similar to the optical switch array 28 might be used as part of the output array 40, which when controlled by the host controller 42, would allow the passage of every Nth 512 by 512 pulse array to the output array 40 for the sensing thereby.

Host controller 42 might take any of various forms, such as a very high speed electronic device operating with a clock rate which is some subharmonic of the pulse rate of the laser system 22, with the shutter over the output array 40 (as well as the other devices controlled by the last controller) being controlled not by successive controller clock cycles, but rather being initiated by the edge of, or a subdivision of, one clock cycle, and being pulsed closed by a one pulse width delay device simultaneously initiated therewith. Obviously it would be desirable to be able to provide an output for each successive pulse time, though the volume of data presented would exceed the capacity of present day computer systems to utilize the same. Thus, the detection of every Nth pulse is quite adequate for current day systems, with the value of N being variable dependent upon the overall system needs, and reducible as detectors improve and data rate requirements increase.

Having described the method and apparatus for maintaining the information in the optical loop and for reading the same, the method and apparatus for "writing" information into the storage system will be described. Thus, referring now to FIG. 2, a schematic diagram similar to FIG. 1, but expanded to include the writing capability may be seen. In this figure, a beam splitter 44 and a source interrupter 46 are interposed between the light 26, from the various channels provided by the diffraction grating 24 and the optical switch array 28. Beam splitter 44 splits off part of the light of each channel of light 26 to be reflected by reflective devices 48 and 50 through a set of optical shutters 52 to provide an equal number of channels of further control light 54, each such channel of control light being directed, or more appropriately directable, onto a respective optical switch of optical switch array 28 as hereinbefore described with respect to light 30 of the various storage channels. The source interrupter 46 as well as the optical shutters 52 may be substantially the same as hereinbefore described with respect to the shutters which may be used over the output array 40, though in the case of both the source interrupter 46 and the optical shutters 52, the shutter for each channel is separately controllable, whereas in general, the shutter over the optical array 40 need only be operable as a single unit.

Figure 2:
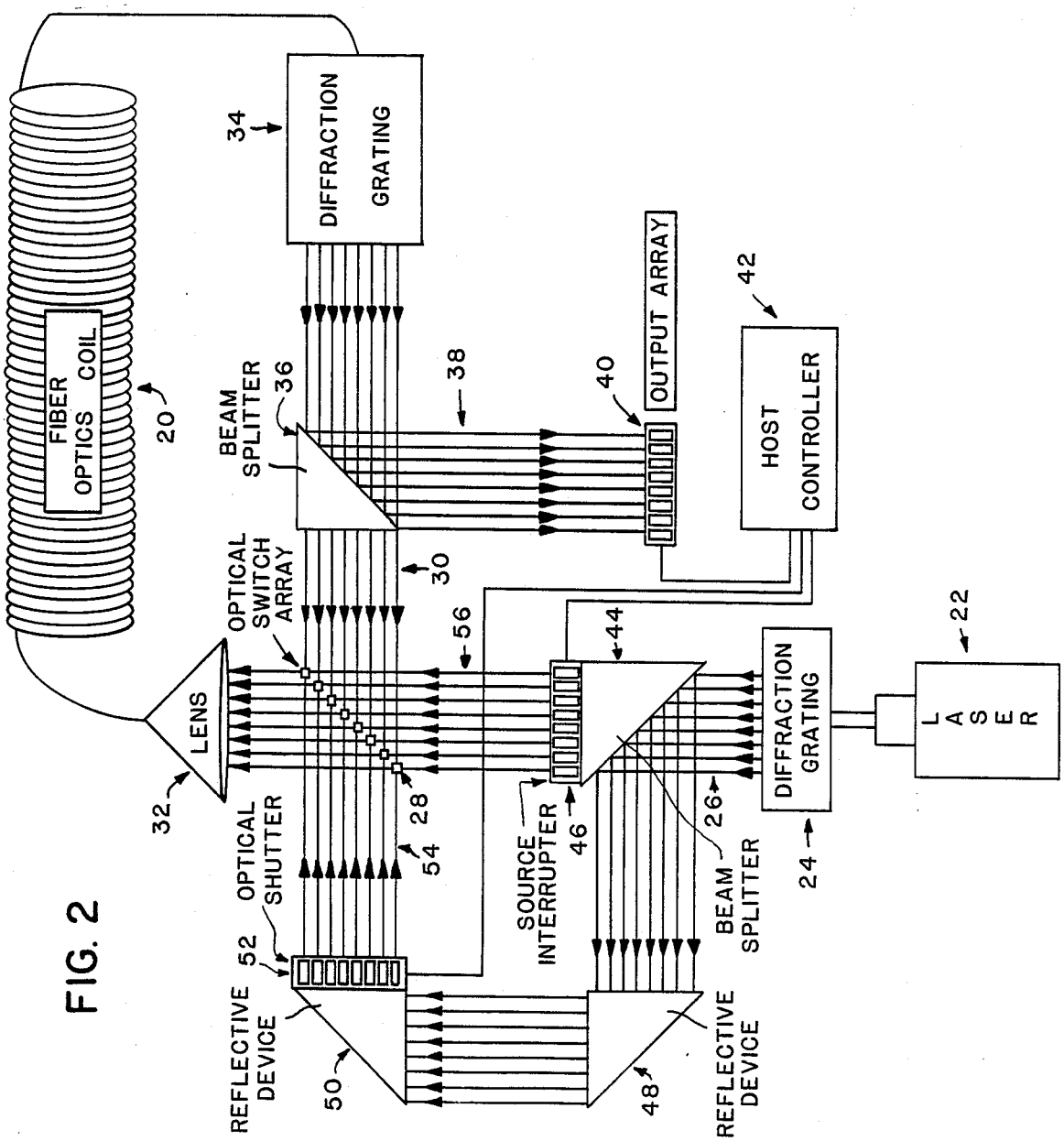
FIG. 2 is a schematic diagram similar to FIG. 1, though further illustrating the method and apparatus for writing data to the optical storage system.

In the data recirculation and read modes hereinbefore described, all shutters of the source interrupter 46 are open and all shutters of the optical shutters 52 are closed. Thus, light 26 of all channels is passed to the optical switch array 28 whereas the control light 54 is off. In essence therefore, the functioning part of the schematic of FIG. 2 is reduced to that illustrated in FIG. 1 and accordingly the operation thereof is as hereinbefore described. For writing to the storage system at any one pulse time, selected shutters of the source interrupter 46 are closed and all optical shutters of optical shutters 52 are open. Thus, during the selected write pulse time, all channels of the optical switch array 28 are open independent of the control light 30 during that pulse time. However, only the specific 512 by 512 array of data as defined by the source interrupter 46 will be passed to gathering lens 32 and to the fiber optic coil 20, so that the 512 by 512 block of data loaded during that pulse time is as defined by the source interrupter 46 at that time, and not as defined by the data block in light 30 which otherwise would be recirculated.

For the foregoing description of the write cycle to properly operate, the light transit time for the light passing through beam splitter 44 and source interrupter 46 to the optical switch array 28 must be equal to the transit time for the light split off by beam splitter 44 and ultimately directed to the optical switch array 28 as control light 54. Accordingly, the shorter path for the direct light as shown in FIG. 2 is a simplification of the Figure, the transit time of the two paths typically being made equal by appropriate routing of the path and/or use of materials through which the speed of light is substantially reduced. Also, as stated before, the host controller 42 normally will operate considerably slower that the source interrupter 46 or the optical shutters 52, so that again one will not normally write data to the storage system on each light pulse, but rather on some sub-multiple thereof, such as before, every Nth pulse. Conveniently, though not necessarily, N may be chosen to have the same value as in the output of data.

In the foregoing description, an entire 512 by 512 block of data was written to the storage system on a given data pulse. If on the other hand data was to be written in smaller blocks, such as by way of example, 256 by 256 blocks, then the appropriate 256 by 256 matrix of the source interrupter shutters 46 and the optical shutters 52 may be controlled as described herein with respect to the write mode, with the remaining three 256 by 256 blocks being controlled as described herein with respect to the recirculation mode. Thus, while writing a 512 by 512 block of data into the 512 by 512 matrix during any one pulse time is particularly convenient, a smaller block may be written into during any one pulse time without disturbing the recirculating data in the remainder of the 512 by 512 matrix.

It is apparent from the foregoing that whatever happens in one channel during any one pulse time must similarly be capable of happening in any other channel during the same pulse time. Consequently, not only do effective optical path lengths need to be matched, by way of example, for the primary channel light as well as the corresponding control light in any one channel, but the same must be true for the other channels in spite of the fact that they are operating with light of different wave lengths. Consequently, due regard must be given for materials in which the speed of light has any significant frequency dependence. In that regard, this effect may be minimized by keeping optical path lengths relatively short where possible. However, because of the length requirement of the fiber optic coil 20, it may be preferable to substitute therefor a light pipe to avoid the accumulation of this problem over the long distances involved. Also, since the regeneration of the information in the fiber optic coil or light pipe 20 depends upon the coincidence in the arrival of pulses in light 56 and light 30 to respective ones of the switches of optical switch array 28, it is apparent that any significant drift in the pulsing frequency will destroy this coherence. For this purpose it is appropriate to measure this coherence to derive an error signal for fine control of the frequency through a lower speed control loop to automatically maintain this coherence as required.

There has been described herein a new and unique optical storage device of high capacity to which data may be written to, maintained and read from, at very high rates. As such, the storage system may be made to look like a conventional storage device such as a disc drive when connected to other equipment. Thus, by way of example, if one chooses to be capable of writing to every Nth pulse position and of reading every Nth pulse position, one might choose to set the pulse frequency so that the total number of pulse positions being recirculated is some multiple M of N. Thus, the storage space would appear to have the same characteristics as a disc drive system having a total of N tracks, each M blocks long, each block containing 256K bits, though obviously this apparent "disc space" may be reproportioned in any way desired for simulating other disc storage space organizations. Once so organized however, timing tracks, data organization, error detection and correction codes, etc., may be the same as are used with conventional storage devices such as disc drive systems.

The encoding scheme described herein with respect to the preferred embodiment comprises the existance of a light pulse in any particular channel for a given pulse time representing a one in an obsence of a pulse for the same pulse time and channel representing a zero. However, it should be noted that other coding techniques may also be used as desired, provided that the coding technique and organization of the system are such as to provide for the regeneration thereof on each circulation through the optical path. Finally, while the system of the present invention is useful for data storage in optical and digital computing, the device may also be used as a platform for recursive optical computing by the placement of optical computing components within the recirculating memory loop. Thus, while the preferred embodiment and various variations thereof have been disclosed and described herein, it will be understood by those skilled in the art that various changes in form and detail may be made therein without departing from the spirit and scope thereof.

We claim:

1. A method of maintaining information contained in the modulation of light in an optical path having an input end and an output end comprising the steps of:
   (a) directing light toward the input end of the optical path from a light source;
   (b) providing an optical control means between the light source means and the input end of the optical path, the control means being a means for controlling the passage of light from the light source means to the input end of the optical path responsive to control light directed thereto; and
   (c) directing light from the output end of the optical path to the optical control means a the control light therefor;
   whereby the information in the light coming from the output end of the optical path is replicated and regenerated in the light directed into the input end of the optical path.

2. The method of claim 1 wherein the optical path is a fiber optic element in coil form.

3. The method of claim 1 wherein the light is pulsed and the modulation thereof is by the presence and absence of pulses thereof.

4. The method of claim 3 wherein the optical control means is a means for passing light based on the polarization thereof and wherein the control means alters the polarization of the light passing therethrough responsive to the control light directed thereto.

5. The method of claim 3 further comprised of the step of selectively controlling the light directed into the input end of the optical path irrespective of the control light to the optical control means, whereby the information in the modulation of light in the optical path may be selectively altered.

6. The method of claim 5 wherein the selective control of light directed to the input end of the optical path is by the selective passing and blocking of light from the light source.

7. The method of claim 1 further comprised of the step of selectively controlling the light directed into the input end of the optical path irrespective of the control light to the optical control means, whereby the information in the modulation of light in the optical path may be selectively altered.

8. The method of claim 1 wherein the light source is a laser light source.

9. A method of maintaining information contained in the modulation of light in a plurality of light frequency separated channels in an optical path having an input end and an output end comprising the steps of:
   (a) directing light toward the input end of the light path in a predetermined plurality of light frequency separated and spatially separated channels;
   (b) providing an optical control means in the path of the light of step (a) for controlling the passage of light in each channel to the input end of the optical path, each responsive to control light directed to the optical control means for the respective channel;
   (c) separating the light eminating from the output end of the optical path into a plurality of light frequency separated and spatially separated channels equal in number and corresponding in frequency, respectively, to the predetermined channels of step (a); and
   (d) for the light in each channel of step (c), directing the light of the respective channel to the optical control means as the control light for the respective light channel of step (a);
   whereby the information in each frequency channel of the light coming from the output end of the optical path is replicated and regenerated in the light directed into the input end of the optical path.

10. The method of claim 9 wherein the optical path is a fiber optic element in coil form.

11. The method of claim 10 wherein the light of each channel is pulsed and the modulation thereof is by the presence and absence of specific pulses thereof.

12. The method of claim 11 wherein the light of all channels is pulsed simultaneously.

13. The method of claim 11 wherein the optical control means passes light based on the polarization thereof, and wherein the control means alters the polarization of the light of each channel passing therethrough responsive to the control light for the respective channel directed thereto.

14. The method of claim 11 further comprised of the step of selectively controlling the light in each channel directed into the input end of the optical path irrespective of the control light to the respective channel of the optical control means, whereby the information in the modulation of light in each channel in the optical path may be selectively altered.

15. The method of claim 14 wherein the selective control of light directed to the input end of the optical path is by the selective passing and blocking of light.

16. The method of claim 9 further comprised of the step of selectively controlling the light in each channel directed into the input end of the optical path irrespective of the control light to the respective channel of the optical control means, whereby the information in the modulation of light in each channel in the optical path may be selectively altered.

17. The method of claim 1 wherein the light source is a laser light source.

18. Apparatus for maintaining information contained in the modulation of light comprising:
   optical means for defining an optical path of substantial length having an input end and an output end;
   light source means for directing light toward the input end of said optical means;
   optical control means between the light source means and the input end of the optical path, said optical control means being a means for controlling the passage of light from the light source means to the input end of the optical path responsive to control light directed thereto;

means for directing light from the output end of said optical means to said optical control means as the control light therefore;

whereby the information in the light coming from the output end of the optical means is replicated and regenerated in the light directed into the input end of the optical means.

19. The apparatus of claim 18 wherein the light from said light source means is pulsed and the modulation thereof is by the presence and absence of pulses thereof.

20. The apparatus of claim 19 wherein said optical control means is a means for passing light based on the polarization thereof and wherein said control means alters the polarization of the light passing therethrough responsive to the control light directed thereto.

21. The apparatus of claim 18 further comprised of the means for selectively controlling the light directed into said input end of said optical means irrespective of the control light to said optical control means from said output end thereof, whereby the information in the modulation of light in the optical path may be selectively altered.

22. The apparatus of claim 21 wherein the selective control of light directed to said input end of the optical means is by the selective passing and blocking of light from said light source means.

23. The apparatus of claim 18 further comprised of means for selectively controlling the light directed into said input end of the optical path irrespective of the control light to said optical control means, whereby the information in the modulation of light in the optical path may be selectively altered.

24. The apparatus of claim 18 wherein said light source means is a laser light source.

25. Apparatus for maintaining information contained in the modulation of light in a plurality of light frequency separated channels comprising:

optical means for defining an optical path of substantial length having an input end and an output end;

light source means for directing light toward said input end of said optical means in a predetermined plurality of light frequency separated and spatially separated channels;

optical control means in the path of the light from said light source means for controlling the passage of light in each channel to said input end of said optical means, each responsive to control light directed to said optical control means for the respective channel;

separation means for separating the light eminating from said output end of the optical path into a plurality of light frequency separated and spatially separated channels equal in number and corresponding in frequency, respectively, to the predetermined channels of said light source means; and means for directing the light of the respective channel from said separation means to said optical control means as the control light for the respective light channel;

whereby the information in each frequency channel of the light coming from the output end of the optical path may be replicated and regenerated in the light directed into the input end of the optical path.

26. The apparatus of claim 25 wherein the light of each channel is pulsed and the modulation thereof is by the presence and absence of specific pulses thereof.

27. The apparatus of claim 26 wherein the light of all channels is pulsed simultaneously.

28. The apparatus of claim 25 wherein said optical control means passes light based on the polarization thereof, and wherein said control means alters the polarization of the light of each channel passing therethrough responsive to the control light for the respective channel directed thereto.

29. The apparatus of claim 24 further comprised of means for selectively controlling the light in each channel directed into said input end of said optical means irrespective of the control light to the respective channel of said optical control means, whereby the information in the modulation of light in each channel in the optical means may be selectively altered.

30. The apparatus of claim 29 wherein the selective control of light directed to said input end of said optical means is by the selective passing and blocking of light.

31. The apparatus of claim 25 wherein said light source means is a laser light source.

* * * * *

UNITED STATES PATENT AND TRADEMARK OFFICE
CERTIFICATE OF CORRECTION

PATENT NO. : 4,856,862
DATED : 8/15/89
INVENTOR(S) : Passmore et al.

It is certified that error in the above-identified patent and that said Letters Patent is hereby corrected as shown below:

col. 01, line 34    after "(Moscow)", delete "2"    insert --12--

Signed and Sealed this

Sixteenth Day of April, 1991

*Attest:*

HARRY F. MANBECK, JR.

*Attesting Officer*    *Commissioner of Patents and Trademarks*